United States Patent [19]

Yoshizumi et al.

[11] Patent Number: 5,328,864

[45] Date of Patent: *Jul. 12, 1994

[54] METHOD OF DOPING GATE ELECTRODES DISCRETELY WITH EITHER P-TYPE OR N-TYPE IMPURITIES TO FORM DISCRETE SEMICONDUCTOR REGIONS

[75] Inventors: Keiichi Yoshizumi, Kokubunji; Satoshi Kudo, Maebashi, both of Japan

[73] Assignee: Hitachi, Ltd., Tokyo, Japan

[*] Notice: The portion of the term of this patent subsequent to Jul. 16, 2008 has been disclaimed.

[21] Appl. No.: 699,024

[22] Filed: May 13, 1991

Related U.S. Application Data

[63] Continuation of Ser. No. 509,445, Apr. 16, 1990, Pat. No. 5,032,537.

[30] Foreign Application Priority Data

Apr. 28, 1989 [JP] Japan .................................. 1-111373

[51] Int. Cl.$^5$ .......................................... H01L 21/336
[52] U.S. Cl. .................................... 437/57; 437/200; 437/984; 437/29; 148/DIG. 106
[58] Field of Search ...................... 437/44, 56, 57, 58, 437/200, 193, 28, 29, 27, 34, 984; 148/DIG. 106; 357/42

[56] References Cited

U.S. PATENT DOCUMENTS

| | | | |
|---|---|---|---|
| 4,740,479 | 4/1988 | Neppl et al. | 437/56 |
| 5,032,537 | 7/1991 | Yoshizumi et al. | 437/57 |

*Primary Examiner*—T. N. Quach

*Attorney, Agent, or Firm*—Pennie & Edmonds

[57] ABSTRACT

The present invention relates to a method of manufacturing a semiconductor device. In a semiconductor substrate formed with a first semiconductor region of P-type and a second semiconductor region of N-type and an insulating film formed between and extending into the first and the second semiconductor regions, gate electrodes of a laminate of a polysilicon layer and a silicide layer are formed on the insulating film covering the first and the second semiconductor regions. A gate electrode situated on the first semiconductor region has an end portion facing and spaced from an end portion of a gate electrode situated on the second semiconductor region. A masking layer is formed on the second semiconductor region with an edge of the masking layer falling between the two gate electrodes where the two end portions face each other. The first semiconductor region is doped with an impurity of N-type, thereby forming a third semiconductor region in the first semiconductor region. The masking layer is removed from the second semiconductor region and a masking layer is formed on the first semiconductor region with an edge of the masking layer falling between the two gate electrodes where the two end portions face each other. The second semiconductor region is doped with an impurity of P-type, thereby forming a fourth semiconductor region in the second semiconductor region. By providing a masking layer to fall between the end portions of the gate electrodes, the gate electrodes are discretely doped to form discrete semiconductor regions.

7 Claims, 6 Drawing Sheets

METHOD OF DOPING GATE ELECTRODES DISCRETELY WITH EITHER P-TYPE OR N-TYPE IMPURITIES TO FORM DISCRETE SEMICONDUCTOR REGIONS

This is a continuation of application Ser. No. 07/509,445, filed Apr. 16, 1990, now U.S. Pat. No. 5,032,537.

BACKGROUND OF THE INVENTION

The present invention relates to a method of manufacturing a semiconductor device. More particularly, it relates to techniques effectively utilized for, for example, a semiconductor device which has both regions doped with P-type and N-type impurities and which includes a gate and/or wiring of a laminate structure of silicide/polysilicon.

With the requirement of manufacture of micro semiconductor devices, fine element forming processes the minimum processing dimension of which is 1.3 μm or less have been developed.

In a semiconductor device, for example, a gate array produced by the fine element forming process, the resistance of each gate electrode, which has been conventionally formed of a polysilicon layer, affects the delay of a signal. Accordingly, a "polycide" layer which is of a laminate structure consisting of a polysilicon layer and a silicide layer has been applied to the gate electrode. The gate array in which the polycide layer is applied to the gate electrode, is described in U.S. Ser. No. 450,897 filed on Dec. 14, 1989, assigned to the same assignee of this application, U.S. Pat. No. 5,075,753.

SUMMARY OF THE INVENTION

Now, problems of the prior art will be explained by taking as an example a technique which is not publicly known, but to which the present invention pertains.

A semiconductor device shown in FIG. 1 is one called CMOS transistors. Numeral 2 designates an N-type semiconductor substrate, and numeral 3 a P-type well region which is formed in one principal surface of the N-type semiconductor substrate 2. A field insulating film 4 for isolating the transistor elements is formed in the upper surface of the N-type semiconductor substrate 2 as well as the P-type well region 3, and a channel stopper layer 8 for preventing parasitic channels is formed under the field insulating film 4. Second N+-type difussion layers 6, 6 are formed at both the end parts of the field insulating film parts 4, 4 in the P-type well region 3; first N+-type diffusion layers 5, 5 each of which overlaps the corresponding second N+-type diffusion layer 6 are formed so as to extend inside the second N+-type diffusion layers 6, 6; and a gate electrode 7 is formed on a gate insulating film 9 in an upper part of the P-type well region between the second N+-type diffusion layers 6, 6. The gate electrode 7 has a laminate structure wherein a polysilicon layer 7a is overlaid with a silicide layer 7b which is made of, for example, WSi (tungsten silicide). Meanwhile, a gate electrode 1 which functions as a wiring is formed on the field insulating film 4. Like the gate electrode 7, the gate electrode 1 has the lamination structure wherein a polysilicon layer 1a is overlaid with a silicide layer 1b made of, for example, WSi.

In addition, first P+-type diffusion layers 10, 10 are formed at the surface of semiconductor substrate between the field insulating film parts ,4, 4, and a gate electrode 11 is formed on a gate insulating film 9 in an upper part of the semiconductor substrate 2 between the first P+-type diffusion layers 10, 10. Like the gate electrode 7, the gate electrode 11 has a laminate structure wherein a polysilicon layer 11a is overlaid with a silicide layer 11b made of, for example, WSi. An interlayer insulating film 12 is formed over the field insulating film 4 as well as the gate electrodes 7, 1 and 11; contact holes 13 are provided in those parts of the interlayer insulating film 12 which overlie the gate electrodes 1, the first N+-type diffusion layers 5 as well as the second N+-type diffusion layers 6, and the first P+-type diffusion layers 10; and first conductive layers 14 made of aluminum are formed in the contact holes 13 and overt he interlayer insulating film 12.

The section illustrated in FIG. 1 is taken along the line I—I of CMOS transistors shown in FIG. 2. This figure shows two basic cells 15 in a gate array. In FIG. 2, however, the pattern of the first conductive layers 14 is omitted. Further, as regards the contact holes 13, only those corresponding to the gate electrodes 1 which form the wiring are illustrated.

Now, an example of a manufacturing process for the semiconductor device thus made will be explained with reference to FIGS. 3 thru 6.

First, a P-type well region 3 is formed in one principal surface of an N-type semiconductor substrate 2, and channel stopper layers 8 are formed in the surface parts of the P-type well region 3 on which a field insulating film (LOCOS film) 4 is to be formed. Thereafter, the field insulating film 4 is formed on the N-type semiconductor substrate 2 as well as the P-type well region 3. Subsequently, gate insulating films 9 are formed between the field insulating film parts 4, 4. Gate electrodes 7, 11 are formed on the gate insulating films 9, while gate electrodes 1 which constitute a wiring are formed on the field insulating film 4. Besides, a resist mask 16 is formed on that part which is to become a PMOS area. Using the resist mask 16, field insulating film 4 and gate electrode 7 as a mask, an N-type impurity is ion-implanted into the whole surface by a dose of, for example, $5 \times 10^{15}$ to $1 \times 10^{16}/cm^2$, thereby to form the first N+-type diffusion layers 5, 5. Then, the state shown in FIG. 3 is presented. The boundary of the resist mask 16 is a part indicated by line A—A in FIG. 2.

At the next step, the resist mask 16 is removed, and a resist mask 17 having an inverted pattern to the resist mask 16 is formed on that part which is to become an NMOS area. Using the resist mask 17, field insulating film 4 and gate electrode 11 as a mask, a P-type impurity is ion-implanted into the whole surface by a dose of, for example, $2 \times 10^{15}/cm^2$, thereby to form first P+-type diffusion layers 10, 10, as shown in FIG. 4. The boundary of the resist mask 17 is indicated by line A—A in FIG. 2.

Here, the gate electrode 1 which is located at the boundary of both the P-type and N-type impurity introduced regions is doped with both the P-type and N-type impurities.

Subsequently, an interlayer insulating film 12 is deposited on the whole surface. Thereafter, contact holes 13, 13 for leading out the first N+-type diffusion layers 5, 5 are formed in the interlayer insulating film 12, while the contact holes 13, 13 are provided in those parts of the interlayer insulating film 12 overlie the gate electrodes 1, as shown in FIG. 5.

Next, as shown in FIG. 6, the PMOS area is covered again with a resist mask 18 the pattern of which is the same as that of the resist mask 16 illustrated in FIG. 3. Using the resist mask 18 and interlayer insulating film 2 as a mask, the ions of an N-type impurity, for example, As ions at $5 \times 10^{15}/cm^2$ are implanted into the whole surface. The ion implantation is intended to form the second N+-type diffused layers 6, 6 for preventing the leakages between the first N+-type diffusion layers 5, 5 and the P-type well region 3.

Here, the part on the left side of the gate electrode 1 in the figures is doped with the N-type impurity again.

Subsequently, the resist mask 18 is removed, and an annealing step is carried out. For example, the annealing is performed at 950° C. for 30 min in an Ar atmosphere containing 1% of oxygen, whereby the implanted As ions are activated and driven into the second N+-type diffusion layers 6, 6. Further, the first conductor layers 14 are formed in correspondence with the contact holes 13. Then, the semiconductor device shown in FIG. 1 is finished up.

Regarding the semiconductor device stated above, the inventor has found out the following problems.

At the annealing step for forming the second N+-type diffused layers, the silicide layer 1b of WSi lying just under the contact hole 13 which is formed at the boundary A—A between the P-type and N-type impurity introducing regions is abnormally oxidized. As shown in FIG. 7, accordingly, the silicide layer 1b peels from the polysilicon layer 1a, and cracks 19 are produced in the interlayer insulating film 12 covering the silicide layer 1b, on account of the peeling.

The phenomenon that the silicide layer 1b peels from the polysilicon layer 1a, is considered to occur due to the following cause. Since the different kinds of ions of high concentrations (the N-type impurity of $5 \times 10^{15}$ to $1 \times 10^{16}/cm^2 + 5 \times 10^{15}/cm^2$, and the P-type impurity at $2 \times 10^{15}/cm^2$) are implanted into the silicide layer 1b through the contact hole 13 formed at the boundary A—A between the P-type and N-type impurity introducing regions, considerably large amount of stresses urging the silicide layer 1b to peel from the polysilicon layer 1a accumulate in this silicide layer 1b lying just under the contact hole 13. The stresses further increases by the annealing performed for forming the second N+-type diffusion layers 6, 6.

Such a phenomenon may occur other than the case of the annealing at the high temperature of 950° C. for forming the second N+-type diffusion layers 6, 6.

Moreover, even if all of the N+-type ion implantation for forming the first N+-type diffusion layers to serve as the source and drain of each NMOS transistor, the P+-type ion implantation for forming the first P+-type diffusion layers to serve as the source and drain of each PMOS transistor, and the N+-type ion implantation for forming the second N+-type diffusion layers to serve as the leakage preventing regions of the NMOS transistor are not performed through the contact noles 13, the aforementioned phenomenon wherein the silicide layer 1b peels from the polysilicon layer 1a might similarly take place in the case of performing through the contact holes 13 the ion implantations of the different kinds of impurities implanted in the above steps, that is, the N+-type ion implantation for forming the source and drain of the NMOS transistor and the P+-type ion implantation for forming the source and drain of the PMOS transistor, or the P+-type ion implantation for forming the source and drain of the PMOS transistor and the N+-type ion implantation for forming the second N+-type diffusion layers.

Such a phenomenon incurs a problem that failures of conduction occurs between the polysilicon layer 1a and the overlying first conductive layer 14, and accordingly the reliability of the semiconductor device degrades.

The present invention has been made in view of such problems, and has an object to provide a semiconductor device in which a silicide layer is prevented from peeling from a polysilicon layer and whose reliability is enhanced.

The above and other objects and novel features of the present invention will become apparent from the description of this specification in conjunction with the accompanying drawings.

A typical example of the present invention is briefly summarized as follows:

In a semiconductor device having both regions doped with P-type and N-type impurities respectively, and a gate or wiring which is made of a lamination structure consisting of a silicide layer and a polysilicon layer, a contact hole which overlies the gate or a wiring is formed so as to avoid a boundary between the domains doped with the P-type and N-type impurities respectively.

According to the structure described above, the contact hole which overlies the gate or a wiring is formed avoiding the boundary between the regions doped with the P-type and N-type impurities respectively. Therefore, the different kinds of impurities are not introduced into the silicide layer, and no stress accumulates in this silicide layer. Accordingly, even when annealing is carried out, the silicide layer is prevented from peeling from the polysilicon layer, and the object of enhancing the reliability of the semiconductor device is accomplished.

DESCRIPTION OF THE PREFERRED EMBODIMENT

Now, an embodiment of a semiconductor device according to the present invention will be described with reference to the drawings.

Figure 2:
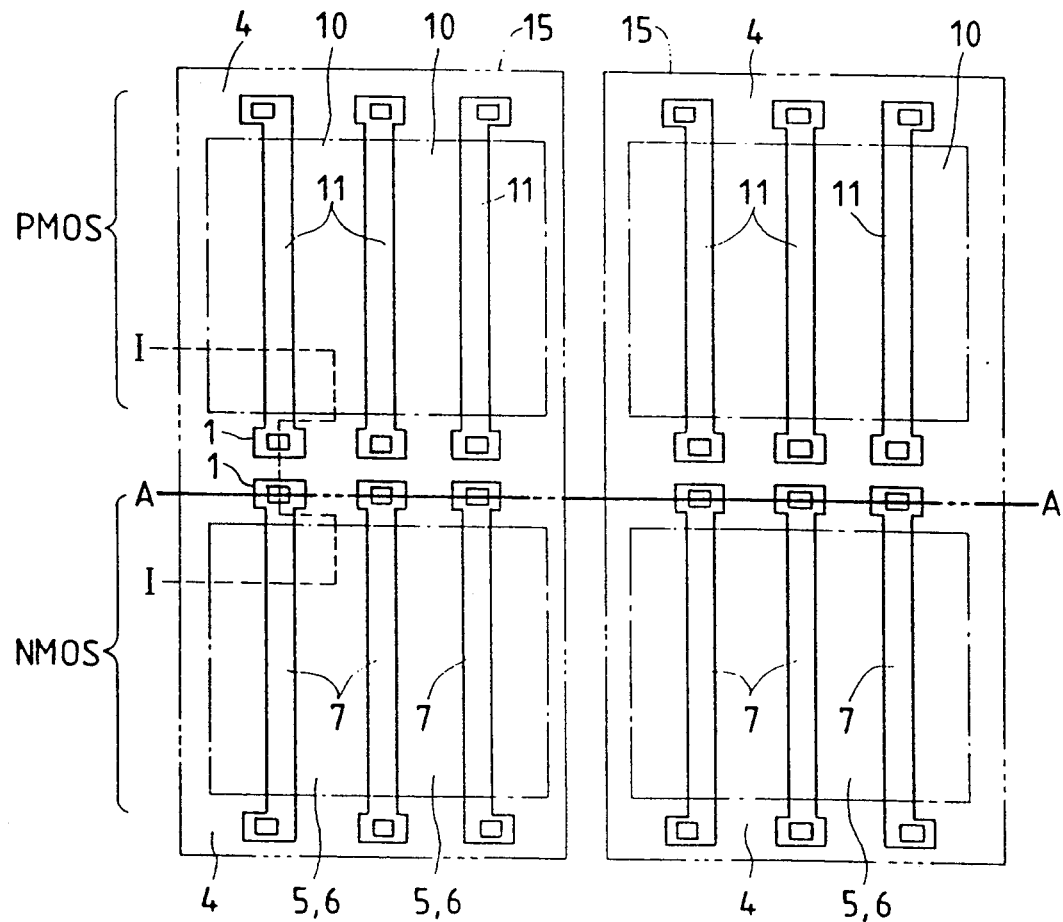
FIGS. 2-7 are views for explaining the problems of the prior art.
Figure 3:
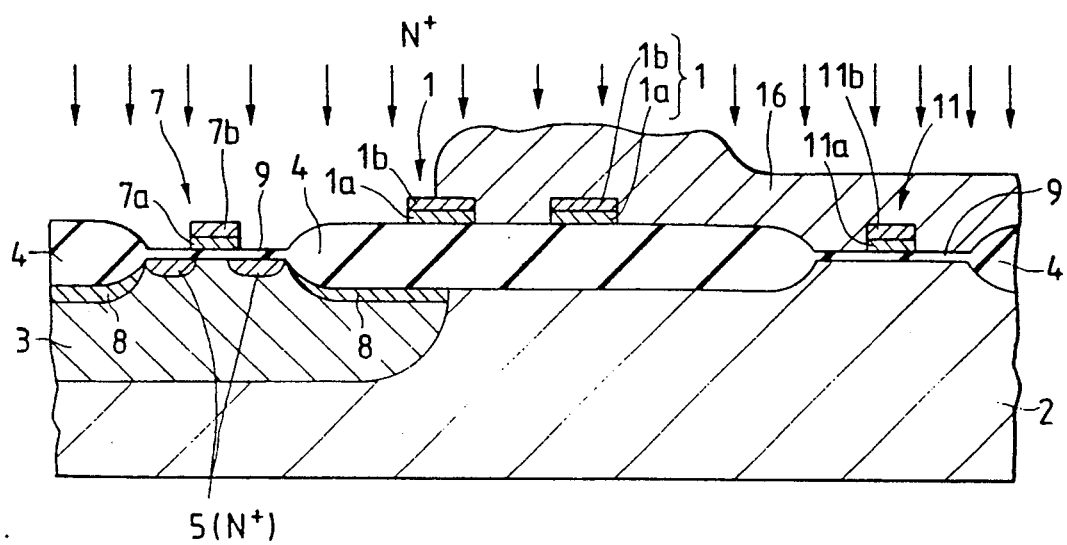
Figure 4:
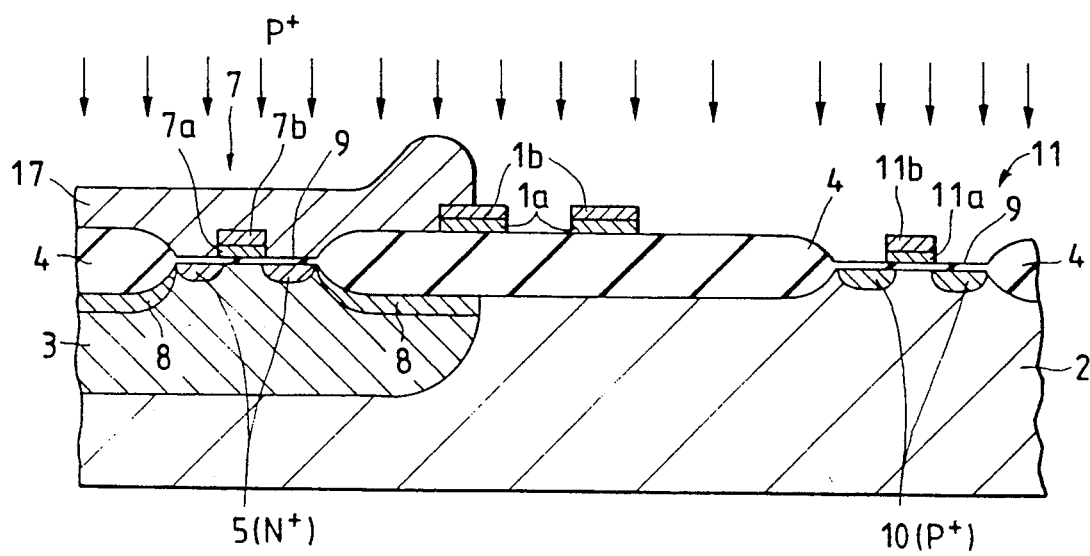
Figure 8:
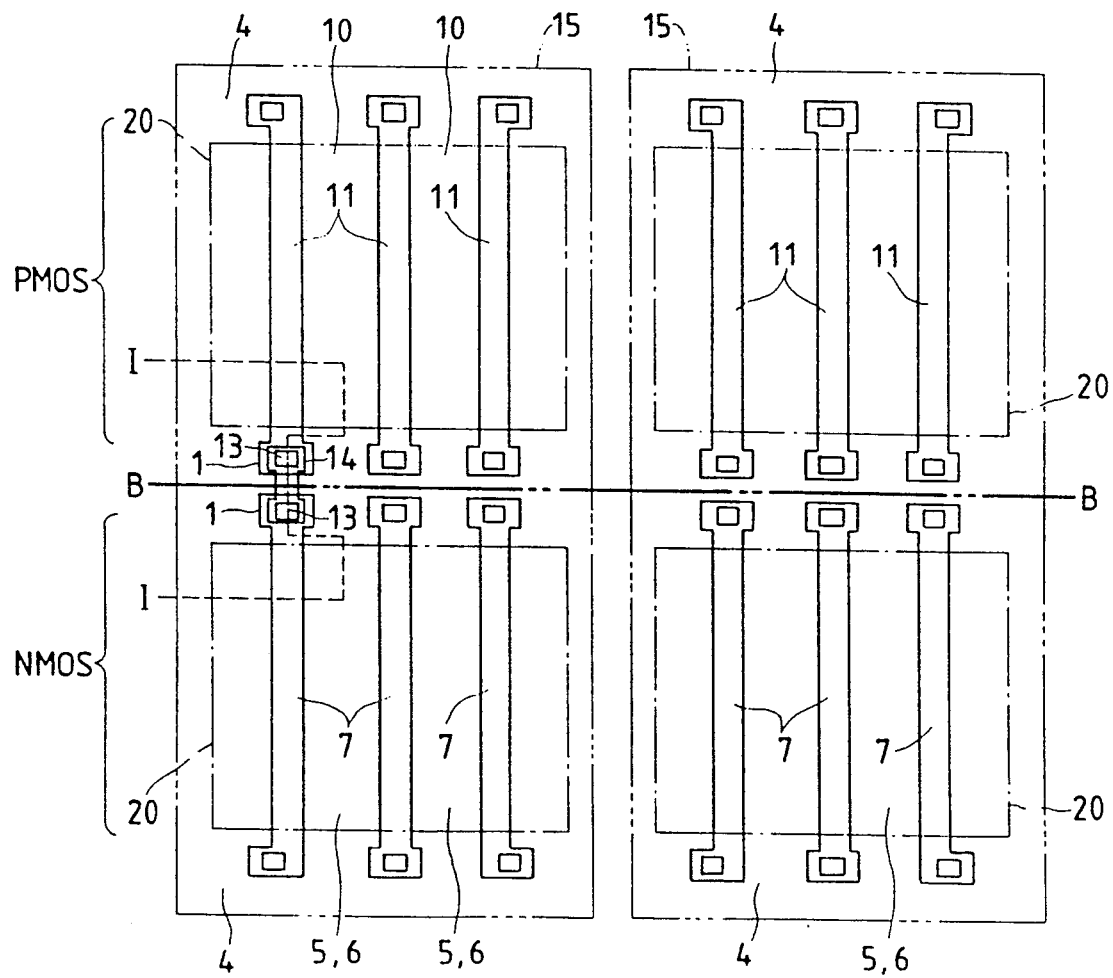
FIG. 8 is a plan view of the essential portions of a semiconductor device according to the present invention.

FIG. 8 shows two basic cells 15 in a gate array which is similar to the gate array in FIG. 2. Each of the basic cells 15 is constructed of three PMOS transistors and three NMOS transistors. The PMOS and NMOS transistors are so arranged that gate electrodes 11 and 7 thereof lie in parallel. The gate electrodes 7, 11 are laid so as to traverse active regions 20 enclosed with dashed lines in FIG. 8, and the end parts thereof are extended on a field insulating film 4 forming a passive region. The parts extending to the field insulating film 4 will be referred to as gate electrodes 1 which form a wiring. The end part of each gate electrode 1 is broader than each gate electrode 7 or 11 (the width of which corresponds to the gate length of the MOS transistor) in order to ensure the positioning allowance of a contact hole 13 which is provided in an interlayer insulating film 12.

As in the case of FIG. 2, the contact holes 13 except those for the gate electrodes 1 forming the wiring are omitted from the illustration of FIG. 8. Regarding the pattern of a first conductor layers 14, only the first conductor layer 14 for connecting the respective gate electrodes 11 and 7 of the PMOS and NMOS transistors at the left part in FIG. 8 is illustrated.

Next, the method of manufacture according to the present invention will be described with reference to FIGS. 8 to 11.

A gate electrode 7 is formed on a gate insulating film 9 on that NMOS forming region (for example, P-type well region 3) in the surface of a semiconductor substrate 2 which is surrounded with a field insulating film 4. Besides, the gate electrode 11 is formed on a gate insulating film 9 on a PMOS forming region (for example, the semiconductor substrate 2) which is similarly surrounded with the field insulating film 4. The gate electrodes 7, 11 are of laminate structures which consist of polysilicon layers 7a, 11a and tungsten silicide layers 7b, 11b formed thereon. The silicide layers 7b, 11b may be layers of the silicide of molybdenum (Mo), titanium (Ti) or tantalum (Ta) other than tungsten (W). Although the gate electrode 7 of each NMOS transistor and the gate electrode 11 of each PMOS transistor are simultaneously formed in this embodiment, they may be formed in separate steps. In addition, the respective gate electrodes 11, 7 of the PMOS and NMOS transistors are extended to the field insulating film 4, thereby to construct gate electrodes 1 which form a wiring.

Figure 9:
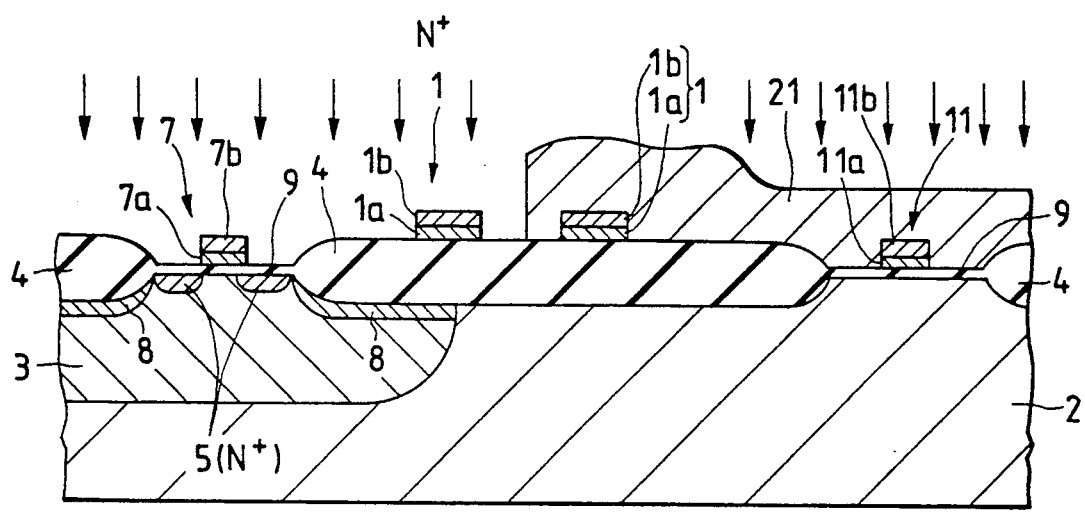
FIGS. 9-11 are sectional views of the essential portions of the semiconductor device according to the present invention.

Subsequently, as illustrated in FIG. 9, the ions of an N-type impurity are implanted in order to form the source and drain regions of the NMOS transistor, namely, first N+-type diffused layers 5. Here, as N-type impurity, arsenic (As) or phosphorus (P) ions thereof are implanted by a dose of $5 \times 10^{15}$ to $1 \times 10^{16}$ atoms/cm$^2$. On this occasion, a resist mask 21 is formed so as to cover the PMOS forming region. The boundary of the resist mask 21 is indicated by a line B—B in FIG. 8. More specifically, the boundary line B—B is set so as not to intersect contact holes 13 which are formed in the parts of the interlayer insulating film 12 overlying the gate electrodes 7, 11. Besides, the boundary line B—B is set so as to lie between the inner end parts of the gate electrode 11 of the PMOS transistor and the gate electrode 7 of the NMOS transistor, namely, on the field insulating film 4.

Figure 10:
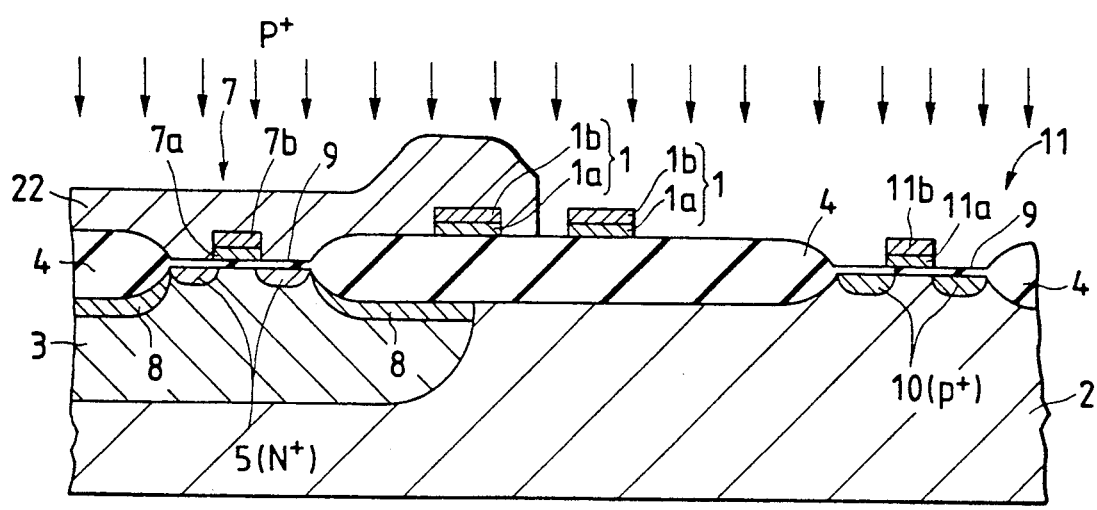

Next, as illustrated in FIG. 10, the ions of a P-type impurity are implanted in order to form first P+-type diffusion layers 10 which serve as the source and drain regions of the PMOS transistor. Boron (B) is employed as the P-type impurity, and the ions thereof are implanted by a dose of $2 \times 10^{15}$ atoms/cm$^2$ or so. On this occasion, a resist mask 22 is formed so as to cover the NMOS forming region. The resist mask 22 has the inverted pattern of the resist mask 21, and the boundary is shown by the line B—B indicated in FIG. 8.

Figure 5:
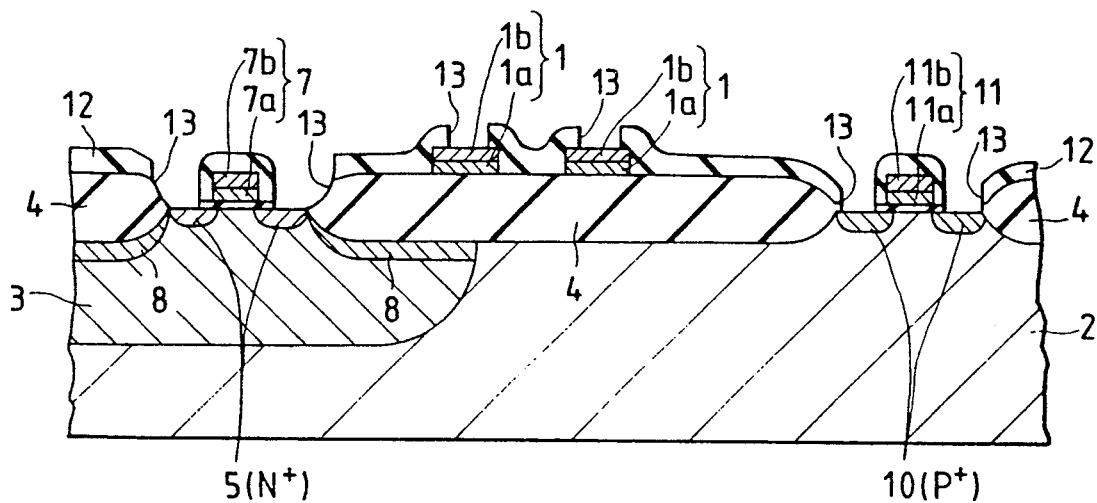
Figure 6:
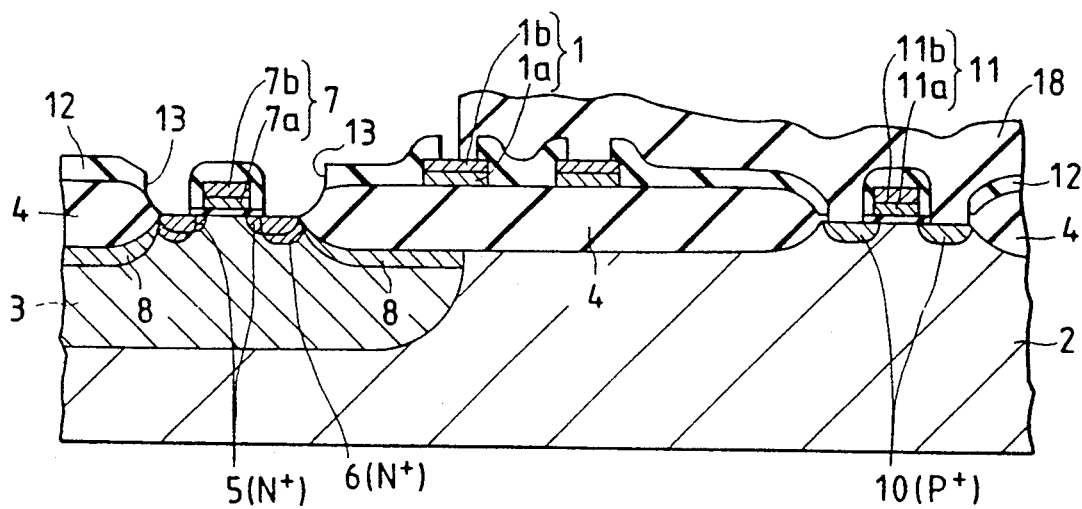
Figure 7:
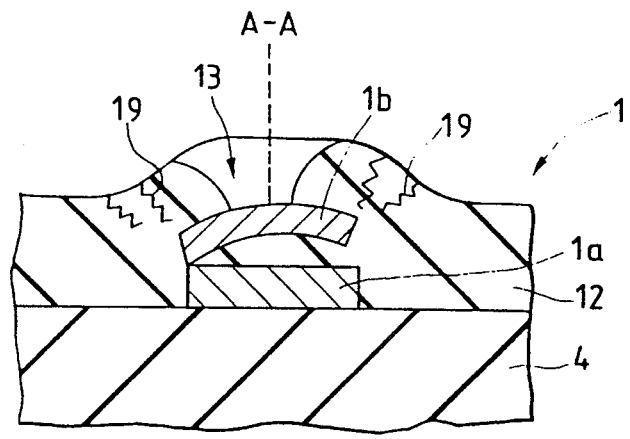

Next, as illustrated in FIG. 5, the interlayer insulating film 12 is formed on the whole surface of the resultant semiconductor substrate 2, and the contact holes 13 are formed in the predetermined parts of the interlayer insulating film 12. The interlayer insulating film 12 is made of any of PSG (phosphosilicate glass), BPSG (borophosphosilicate glass) and BSG (borosilicate glass).

Figure 11:
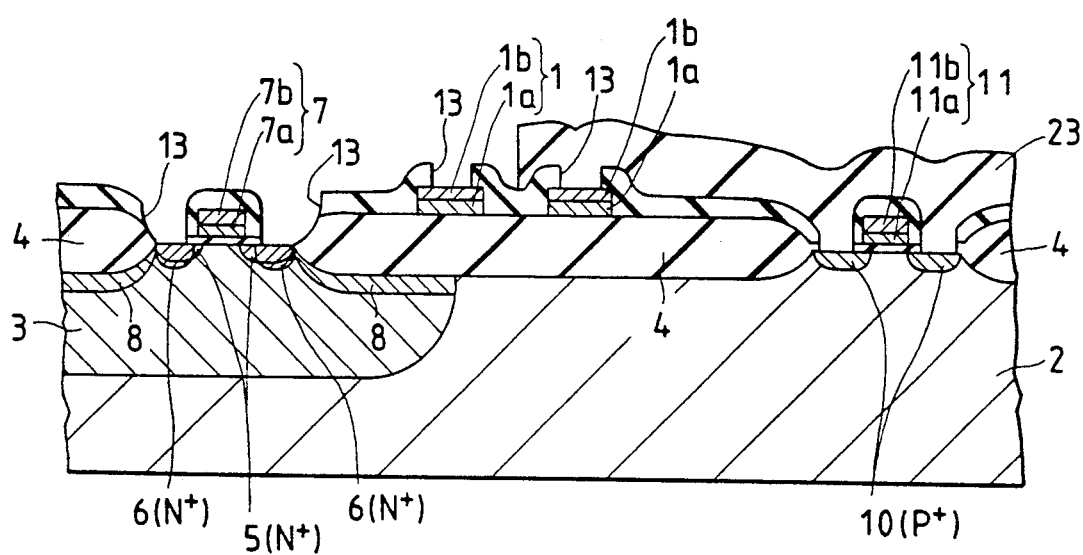

Next, as also illustrated in FIG. 11, the ions of an N-type impurity are implanted in order to prevent the short-circuiting between the P-type well region 3 and first conductive films 14 which are connected to the source and drain regions 5, 5 of the NMOS transistor. A resist mask 23 shown in FIG. 11 is employed for the ion implantation, and it has the same pattern as that of the resist mask 21 used in the ion implantation step for forming the source and drain regions 5, 5 of the NMOS transistor. On this occasion, the ions of arsenic (As) are implanted by a dose of $5 \times 10^{15}$ atoms/cm$^2$ or so. Thereafter, the resist mask 23 is removed, and annealing is performed at 950° C. for 30 min in an Ar atmosphere containing 1% oxygen. Thus, second N+-type diffusion layers 6, 6 are formed.

Figure 1:
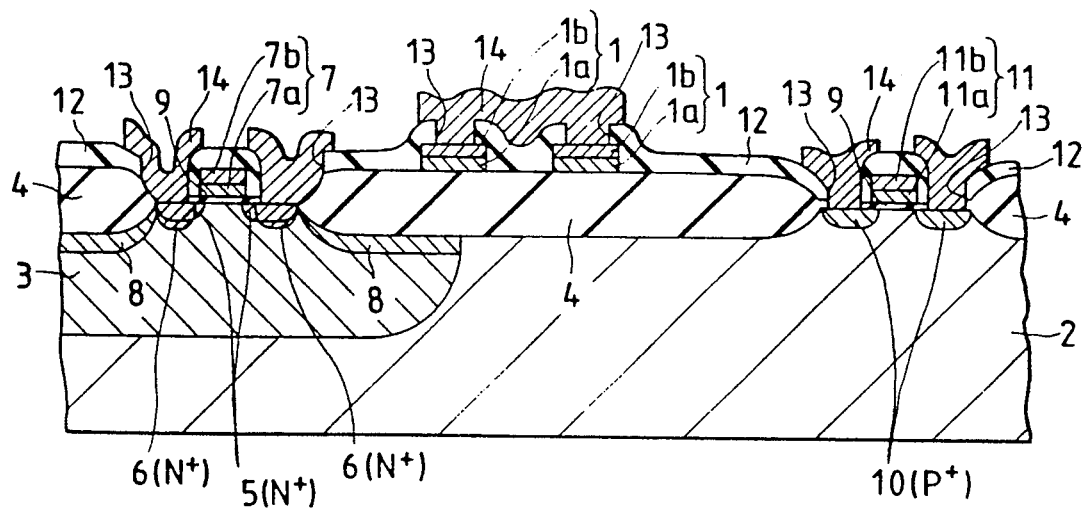
FIG. 1 is a sectional view of the essential potions of a semiconductor device according, to the present invention and for explaining the problems of the prior art.

Further, the first conductive layers 14 of aluminum are formed. Then, a semiconductor device as shown in FIG. 1 is finished up.

As thus far described, in the case where the mask layers for introducing the impurities of the different conductivity types have the inverted patterns to each other, the boundary between the mask layers is prevented from passing the contact holes 13 which are provided in the interlayer insulating film 12 overlying the gate electrodes 7, 11 of the polycide structure. In this way, the silicide layers 7b, 11b can be prevented from peeling from the polysilicon layers 7a, 11a.

In addition, the annealing step for forming the second N+-type diffusion layers 6, 6 may be the heat treatment for the reflow of the interlayer insulating film 12.

Besides, although the PMOS transistors are formed on a surface of the semiconductor substrate 2 in this embodiment, they may be formed in an N-type well region provided on the surface of the semiconductor substrate 2.

Moreover, although this embodiment has been described as to the gate array as an example, the present invention is obviously applicable to any semiconductor device of CMOS structure.

What is claimed is:

1. A method of manufacturing a semiconductor device on a semiconductor substrate having a first insulating film on a first semiconductor region of P-type and a second semiconductor region of N-type formed on said semiconductor substrate, comprising the steps of:

(a) forming a first conductor layer comprising a laminate film including a polysilicon layer and a silicide layer thereon, said first conductive layer extending continuously from said first semiconductor region to said first insulating film, said first conductive layer having first end portion on said first insulating film;

(b) forming a second conductive layer comprising a laminate film including a polysilicon layer and a silicide layer thereon, said second conductive layer extending continuously from said second semiconductor region to said first insulating film, said second conductive layer having a first end portion on said first insulating film, wherein said first end portion of said second conductive layer is adjacent to and opposing said first end portion of said first conductive layer;

(c) forming a first mask layer over at least a part of said second semiconductor region, with an end portion thereof formed between said first end portion of said first conductive layer and said first end portion of said second conductive layer, said end portion of said first mask layer being formed over said first insulating film;

(d) introducing first impurities of the N-type into said first semiconductor region which is not covered with said first mask layer, thereby to form third semiconductor regions as in self-alignment manner with said first conductive layer;

(e) forming a second mask layer over at least a portion of said first semiconductor region, with an end portion thereof formed between said first end portion of said first conductive layer and said first end portion of said second conductive layer, said end portion of said second mask layer being formed over said first insulating film; and (f) introducing second impurities of P-type into said second semiconductor region which is not covered with said second mask layer, thereby to form fourth semiconductor regions in self-alignment manner with said second conductive layer.

2. A method of manufacturing a semiconductor device according to claim 1, further comprising the steps of:

forming a second insulating film over at least said first and second conductor layers and then providing first and second holes over said first insulating film and through said second insulating film to expose said first and second conductive layers respectively.

3. A method of manufacturing a semiconductor device according to claim 2, wherein the step of providing holes further comprises the step of providing third and fourth holes through said second insulating film to expose third and fourth semiconductor regions respectively.

4. A method of manufacturing a semiconductor device according to claim 3, further comprising the steps of:

forming a third mask layer over said second insulating film, said third mask covering said second and fourth holes;

introducing impurity of N-type to the exposed areas of said first and third holes, which are not covered with said third mask layer; and annealing said semiconductor substrate to form fifth semiconductor regions in said exposed areas where said N-type impurity has been further introduced.

5. A method of manufacturing a semiconductor device according to claim 2, further comprising the step of forming a third conductive layer over said second insulating film and said first and second holes.

6. A method of manufacturing a semiconductor device according to claim 5, wherein said second mask layer has a pattern inverted to that of said first mask layer.

7. A method of manufacturing a semiconductor device according to claim 5, wherein said third conductive layer comprises aluminum.

* * * * *